(12) United States Patent
Krivokapic et al.

(10) Patent No.: US 6,605,843 B1
(45) Date of Patent: Aug. 12, 2003

(54) FULLY DEPLETED SOI DEVICE WITH TUNGSTEN DAMASCENE CONTACTS AND METHOD OF FORMING SAME

(75) Inventors: Zoran Krivokapic, Santa Clara, CA (US); Allison Holbrook, San Jose, CA (US); Sunny Cherian, San Jose, CA (US); Kai Yang, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 33 days.

(21) Appl. No.: 09/637,450

(22) Filed: Aug. 11, 2000

(51) Int. Cl.⁷ .................. H01L 27/01; H01L 27/12; H01L 31/0392; H01L 29/76; H01L 29/94
(52) U.S. Cl. .................. 257/347; 257/348; 257/388
(58) Field of Search .................. 257/347, 348, 257/349, 350, 351, 352, 353, 354, 401, 412, 413, 388; 438/479, 480, 517

(56) References Cited

U.S. PATENT DOCUMENTS 5,489,795 A * 2/1996 Yoshimura et al. ......... 257/369
5,760,442 A * 6/1998 Shigyo et al. ............... 257/347
6,303,447 B1 * 10/2001 Chhagan et al. ............ 438/299
6,339,244 B1 * 1/2002 Krivokapic .................. 257/349

FOREIGN PATENT DOCUMENTS

JP         404114476 A  *  4/1992  ................. 257/347

* cited by examiner

Primary Examiner—Shouxiang Hu
(74) Attorney, Agent, or Firm—Renner, Otto, Boisselle & Sklar

(57) ABSTRACT

A fully depleted field effect transistor formed in a silicon on insulator (SOI) substrate includes a body region formed in a silicon device layer over an isolation layer of the SOI substrate. A gate is positioned above the body region and includes a base gate region adjacent the body region and a wide top gate region formed of tungsten damascene and spaced apart from the body region. An inverted T-shaped central channel region is formed between adjacent source regions and drain region in the body region.

16 Claims, 7 Drawing Sheets

FULLY DEPLETED SOI DEVICE WITH TUNGSTEN DAMASCENE CONTACTS AND METHOD OF FORMING SAME

TECHNICAL FIELD

The present invention relates generally to silicon-on-insulator (SOI) structures, and more specifically to a fully depleted SOI structure formed on a silicon-on-insulator substrate which includes tungsten damascene contacts.

BACKGROUND OF THE INVENTION

Conventional or bulk semiconductor devices are formed in semiconductive material by implanting a well of either P-type or N-type conductivity silicon in a silicon substrate wafer of the opposite conductivity. Gates and source/drain diffusions are then manufactured using commonly known processes. These form devices known as metal-oxide-semiconductor (MOS) field effect transistors (FETs). When a given chip uses both P-type and N-type, it is known as a complimentary metal oxide semiconductor (CMOS). Each of these transistors must be electrically isolated from the others in order to avoid shorting the circuits. A relatively large amount of surface area is needed for the electrical isolation of the various transistors. This is undesirable for the current industry goals for size reduction. Additionally, junction capacitance between the source/drain and the bulk substrate and "off" state leakage from the drain to the source both increase power consumption. Junction capacitance also slows the speed at which a device using such transistors can operate. These problems result in difficulties in reducing the size, power consumption, and voltage of CMOS technology devices.

In order to deal with the junction capacitance and "off state" leakage problem as well as obtain reduced size, silicon-on-insulator technology (SOI) has been gaining popularity. SOI technology employs a thin silicon device layer of monocrystalline silicon material overlying an insulating layer on a bulk wafer. The structure can be formed by a number of well-known techniques, such as zone melting and recrystallization (ZMR), separation by implanted oxygen (SIMOX), or Bonded and Etchback (BESOI).

Field effect transistors fabricated in the silicon device layer have many advantages over bulk silicon FETs fabricated in the traditional bulk silicon substrates including resistance to short-channel effect, steeper subthreshold slopes, increased current drive, higher packing density, reduced parasitic capacitance, and simpler processing steps.

These advantages combined with the continually increasing cost of bulk silicon submicron integrated circuit processes and the lower complexity/cost of SOI integrated circuit processes, SOI technology shows great potential to become the low cost mainstream production technology.

Despite the advantages, there are problems with SOI technology which limit its performance. Unlike bulk silicon FETs, the body of an SOI FET is usually electrically floating. In a non-fully depleted FET (e.g. the silicon film thickness is greater than the maximum channel depletion width), carriers (holes in n-channel FETs and electrons in p-channel FETs) generated by impact ionization accumulate near the source/body junction of the FET. Eventually sufficient carriers will accumulate to forward bias the body with respect to the source thus lowering the threshold voltage through the body-bias effect. Extra current will start flowing resulting in a "kink" in the I-V characteristics. This reduces the achievable gain and dynamic swing in analog circuits, and gives rise to abnormality in the transfer characteristics in digital circuits.

In a fully-depleted SOI FET (e.g. silicon film thickness that is less than the maximum channel depletion width), the channel is depleted completely under normal operations. The source/channel junction has a lower potential barrier, and the carriers generated by impact ionization have smaller effect on the body and channel potential, thus the "kink" softens.

However, in fully-depleted FETs, the depletion charge is reduced for a given body doping concentration, leading to a smaller threshold voltage. Threshold voltage becomes very sensitive to variations in the silicon film thickness and therefore, fabrication of high performance circuits can be very difficult. Additionally, the reduction of silicon film thickness in a fully-depleted FET gives rise to high source/drain series resistance which in turn lowers the operating speed of the device. One solution to the series resistance problem is to selectively reduce the silicon film thickness over the channel region. However, the resulting recessed region and the polysilicon gate are not automatically aligned. To allow for the possible misalignment, the recessed thin silicon region must be made longer than the gate. This reduces the device performance and density, and results in asymmetrical devices.

Accordingly, there is a strong need in the art for a semiconductor circuit structure, and a method for forming such structure, that includes a fully depleted channel to eliminate the "kink" in the I-V curve but does not suffer the problems of poor output resistance and slowed operating speed. Further, there a need in the art for such a device which does not suffer possible misalignment caused by fabrication processes which do not automatically align the gate, source and drain regions of the FET.

SUMMARY OF THE INVENTION

A first aspect of the present invention is to provide a fully depleted field effect transistor (FET) with a tungsten damascene top gate. The FET is formed in a silicon on insulator substrate which includes a thin device layer positioned over an insulating layer. The FET comprises a body region formed in the silicon device layer and including a source region and a drain region of a first conductivity semiconductor on opposing sides of a central channel region of an opposite conductivity semiconductor. A base gate region is positioned above the central channel region and a wide top gate region comprised of tungsten damascene is spaced apart from the central channel region and positioned over the base gate region. The tungsten damascene forms a contact between the base gate region and metal layers of an integrated circuit utilizing the FET.

In the preferred embodiment, the central channel region is an inverted T-shaped central channel region with a narrow full depletion region adjacent the base gate region and a wide channel region adjacent the insulating layer. The narrow full depletion region may have a channel width that is less than a width of the base gate region and the wide channel region may have a width approximately equal to a width of the top gate region.

A second aspect of the present invention is to provide a semiconductor device comprising a plurality of fully depleted field effect transistors formed on a semiconductor substrate. Each fully depleted FET comprises: a) a body region including a source region and a drain region of a first conductivity semiconductor on opposite sides of a central channel region of an opposing conductivity semiconductor;

b) an insulating layer positioned below the body region isolating the body region from the semiconductor substrate; c) a base gate region positioned above the central channel region; and d) a wide top gate region comprised of tungsten damascene and spaced apart from the central channel region.

The central channel region of each transistor may be an inverted T-shaped central channel region with a narrow full depletion region adjacent the base gate region and a wide channel region adjacent the insulating layer. The narrow full depletion region of each transistor may have a-channel width that is less than a width of the base gate region and the wide channel region of each transistor may have a channel width approximately equal to a width of the wide top gate region.

The semiconductor device may further include a plurality of isolation trench regions isolating the body region of each transistor from adjacent transistors and the substrate may be a semiconductor of the same first conductivity semiconductor as the central channel region.

A third aspect of the present invention is to provide a method of fabricating a fully depleted field effect transistor with a tungsten damascene top gate region. The fully depleted FET is formed in a silicon on insulator substrate including a thin device layer of a first conductivity semiconductor positioned over an insulating layer. The method comprises: a) isolating a body region in the device layer; b) forming a base gate region above the body region; c) doping a thin top portion of the body region on opposing sides of the base gate region to an opposite conductivity semiconductor as the first conductivity semiconductor; d) forming a layer of nitride over the base gate region and the body region of the device layer such that the nitride has a vertical thickness adjacent to the base region that is thicker than a vertical thickness across the surface of the body region; e) doping a deep portion of the body region on opposing sides of the base gate region to the opposite conductivity silicon to form an inverted T-shaped central channel region of the first conductivity semiconductor positioned between a source region and a drain region of the opposite conductivity semiconductor; and f) forming a wide tungsten damascene top gate region above the base gate region.

The step of forming the base gate region may include forming a polysilicon layer over the body region; forming a mask layer over the polysilicon layer; patterning the mask layer to define the base gate region; and etching the mask layer and the polysilicon layer to form the base gate region. The step of forming the wide tungsten damascene top gate region may include depositing a layer of TEOS over the layer of nitride; polishing the TEOS to expose an island of nitride over the base gate region; etching the nitride to form a well extending to the base gate region; and forming a diffusion barrier over the exposed base gate region and filling the well with tungsten damascene from the wide tungsten damascene top gate region.

The step of doping the deep portion may include implanting impurity ions utilizing a 15–25 KeV electric field and the step of doping the thin top portion may include implanting impurity ions utilizing a 10–20 KeV electric field.

The method of fabricating a fully depleted field effect transistor with a tungsten damascene top gate region may further include forming source and drain tungsten damascene contacts. Forming such contacts may include: a) etching the nitride to form a well over each of the source region and the drain region to expose the source region and the drain region; b) forming a titanium nitride diffusion layer over the exposed source region and drain region; and c) filling each of the wells with tungsten damascene to from the tungsten damascene contacts.

Description of the Preferred Embodiment

Figure 1:
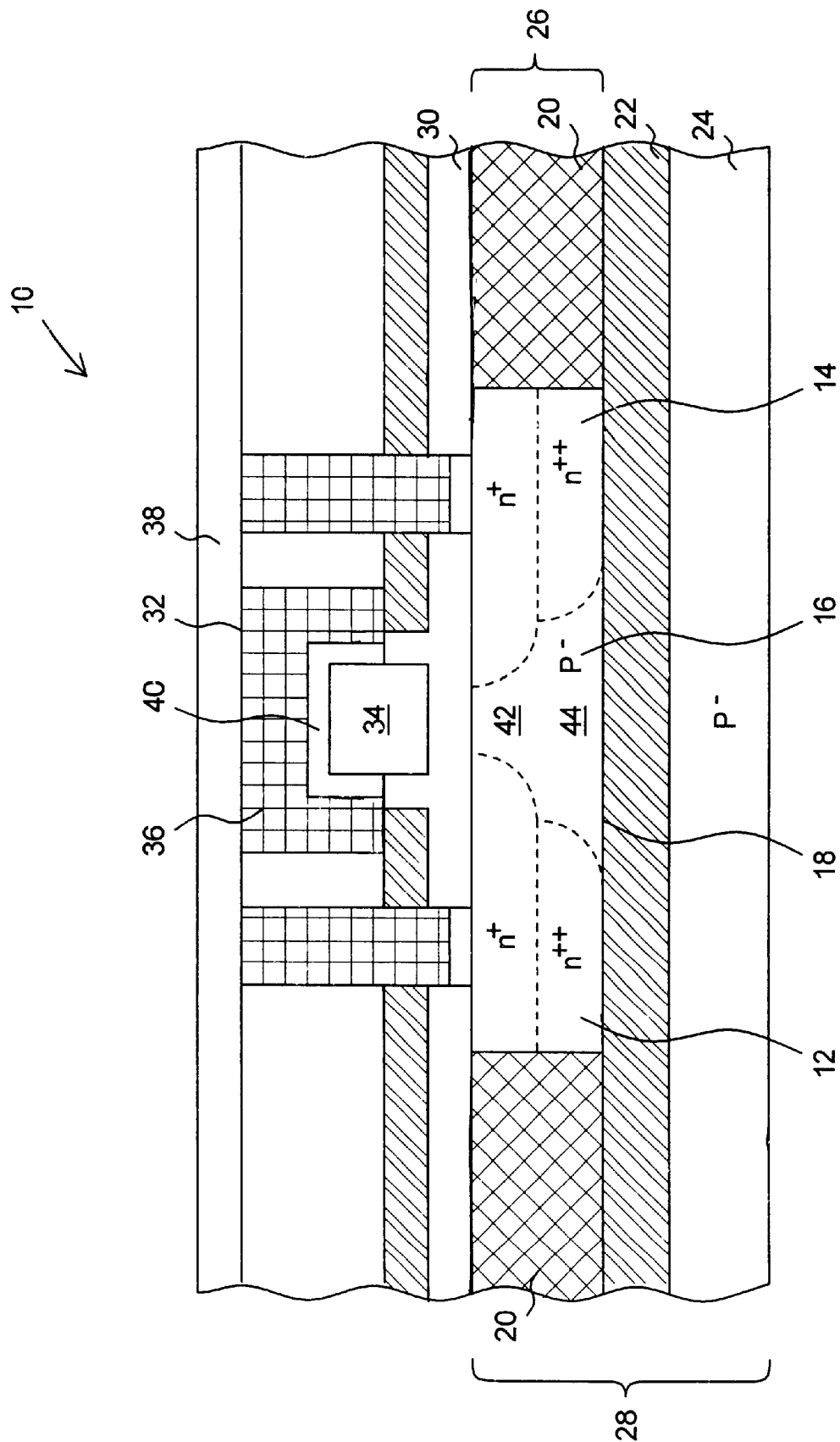
FIG. 1 is a cross section diagram of a fully depleted field effect transistor (FET) in accordance with one embodiment of this invention.

The present invention will now be described in detail with reference to the drawings. In the drawings, like reference numerals are used to refer to like elements throughout.

Referring to FIG. 1, a fully depleted silicon on insulator (SOI) field effect transistor (FET) 10 with a wide tungsten damascene gate cap is shown. FET 10 is formed in an SOI wafer 28 which includes a thin silicon device layer 26 formed on the top of an insulating oxide layer 22 which is on top of a bulk silicon substrate 24. The FET 10 includes an active region 18 which comprises a source region 12, a drain region 14, and a channel region 16. In the exemplary embodiment, the FET 10 is an n-type FET which includes an n-conductivity silicon source region 12 and an n-conductivity silicon drain region 14 separated by a p-conductivity silicon channel region 16. However, in accordance with known semiconductor technology, the channel region 16 may be n-conductivity silicon while each of the source region 12 and drain region 14 may be p-conductivity silicon.

The active region 18 is isolated from the bulk silicon substrate 24 by the insulating oxide layer 22. Insulating trenches 20 which extend through the silicon device layer 26 to the insulating oxide layer 22 isolate the active region 18 of FET 10 from other devices (not shown) that may be formed in the silicon device layer 26. A gate oxide layer 30 is on the top surface of the active region 18 and isolates the active region 18 from a gate 32. The gate 32 includes a polysilicon base gate region 34 adjacent to the gate oxide layer 30 and a tungsten damascene wide cap region 36. The tungsten damascene wide cap region 36 is positioned to the top and sides of the base gate region 34 and forms a contact coupling the base gate region to the metal layers 38. A thin titanium nitride diffusion barrier 40 prevents diffusion between the tungsten damascene cap region 36 and the base gate region 34.

The channel region 16 includes an upper region 42 adjacent to the gate oxide layer 30 and a lower region 44 adjacent to the insulating oxide layer 22. In the preferred embodiment, the upper region 42 has a width of less than 20 nm and the lower region 44 has a width of approximately 50 nm. The silicon device layer 26 has a thickness of 20–30 nm and the insulating oxide layer is approximately 30–70 nm thick.

It should be appreciated that the upper region 42 has a width less than the thickness of the silicon device layer 26 while the lower region 44 has a width greater than the thickness of the silicon device layer 26.

As such, FET 10 is a combination of both a short channel and a long channel device. While in the "on" state (e.g. gate 32 is charged), the upper region 42 may fully deplete to enable the FET 10 to behave as a fully depleted FET to eliminate the "kink" in the I-V curve. However, while in the "off" state, the device behaves as a long channel device eliminating off-state current leakage.

Figure 2:
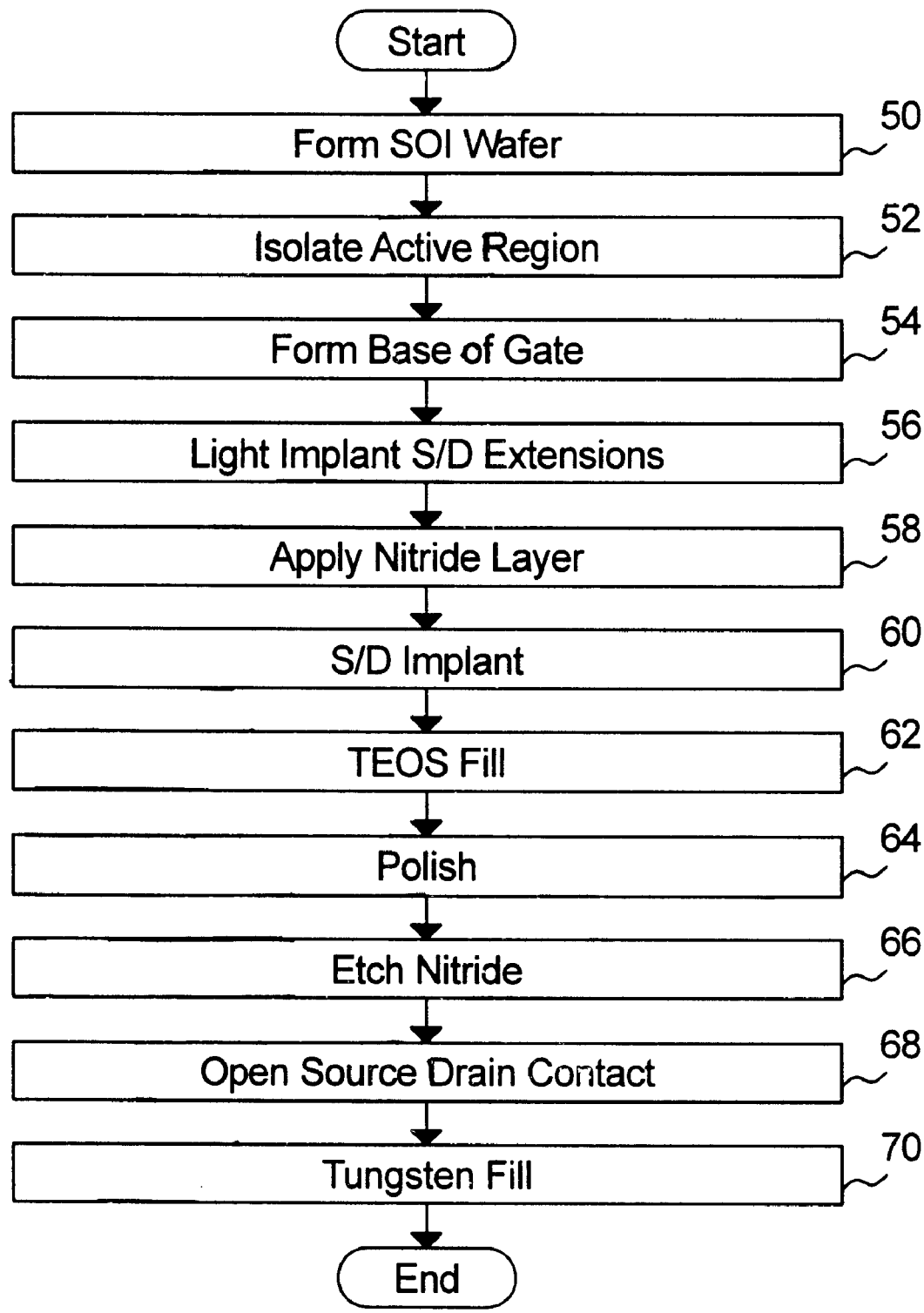
FIG. 2 is a flow chart showing exemplary steps in fabricating the FET of FIG. 1.

FIG. 2 shows a flow chart of exemplary processing steps for forming the FET 10 structure of FIG. 1. FIGS. 3a to 3j each show a cross section of the structure of the FET 10 at various partially complete processing steps as described in the flowchart of FIG. 2. Therefore, referring to FIG. 2 in conjunction with FIGS. 3a to 3j, fabrication of FET 10 is shown.

Figure 3A:
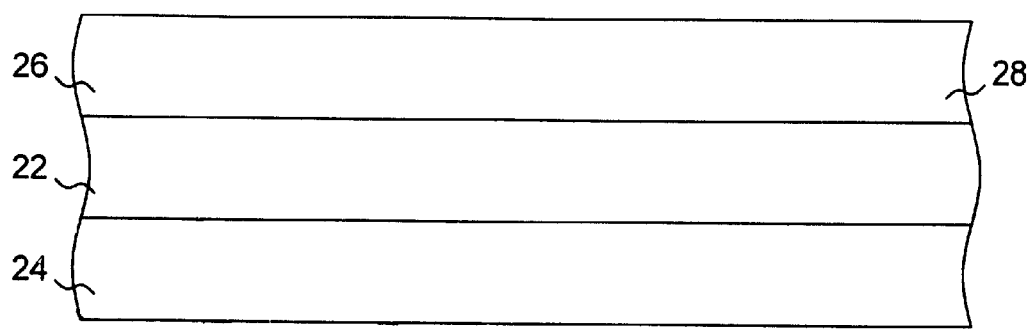
FIG. 3a is a cross section diagram of showing the structure of the FET of FIG. 1 at a partially complete fabrication step.

Step 50 represents forming the SOI wafer 28 which can be forming using techniques known in the art such as zone melting and recrystallization (ZMR), separation by implanted oxygen (SIMOX), or Bonded and Etchback (BESOI). FIG. 3a shows the SOI wafer 28 with the silicon device layer 26, approximately 20–30 nm thick, above the insulating layer 22, approximately 30–70 nm thick, above the bulk silicon 24.

Figure 3B:
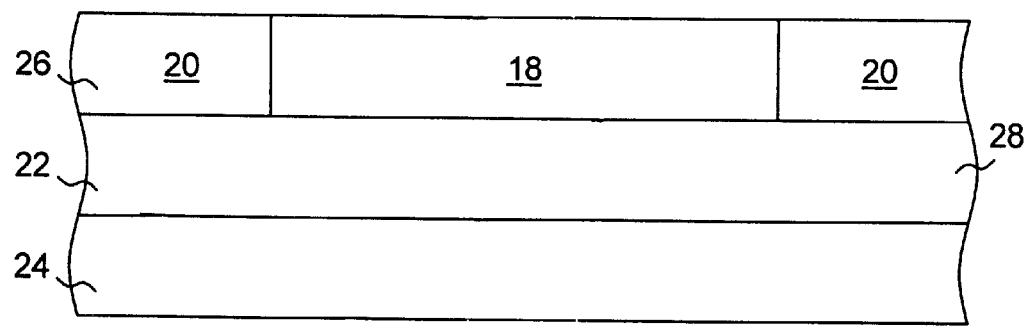
FIG. 3b is a cross section diagram of showing the structure of the FET of FIG. 1 at a partially complete fabrication step.

Step 52 represents isolating the active region 18 by forming insulating trenches 20 in the silicon device layer 26 as shown in FIG. 3b. The insulating trenches 20 may be formed using known etch, fill, and polish techniques. More specifically, a silicon nitride mask may be formed to cover and protect the substrate in the area where the active region 18 of FET 10 is to be formed while leaving the area where the insulating trenches 20 are to be formed exposed. More specifically, the silicon nitride mask may be formed by depositing a layer of silicon nitride approximately 1,500–2,000A thick over an oxide on the surface of the silicon device layer and patterning and etching such silicon nitride layer using known photolithography techniques. Thereafter, the unmasked portions of the silicon device layer 26 (e.g. the portions corresponding to the insulating trenches 20 where the silicon nitride mask has been etched away) are etched away form open trenches through the silicon device layer 26 to the insulating oxide layer 22. More specifically, the etching process for the silicon device layer may include an anisotropic dry etch using hydrogen bromide (HBr). Thereafter, the open trenches are filled with silicon dioxide to form insulating trenches 20. Filling the open trenches preferably uses any known technique for forming silicon dioxide in an open trench such as filling the trench with SiH4 or TEOS and subsequently oxidizing either of such compounds to form insulating silicon dioxide. After filling the open trenches, the surface of the wafer 28 is polished using a chemical mechanical polish to remove any excess silicon dioxide layer and the remaining silicon nitride mask and yield an isolated active region 18 in the silicon device layer 26 as shown in FIG. 3b.

Figure 3C:
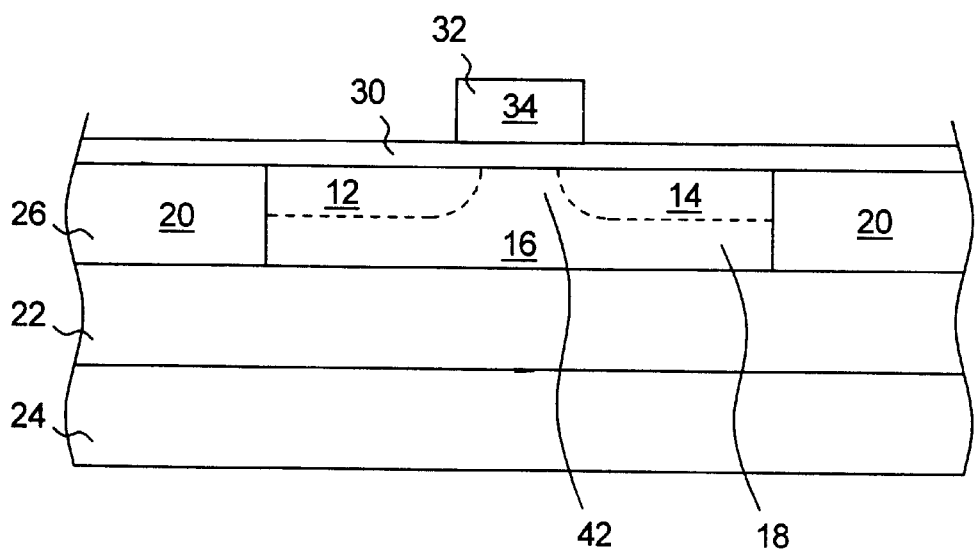
FIG. 3c is a cross section diagram of showing the structure of the FET of FIG. 1 at a partially complete fabrication step.

Step 54 represents forming the polysilicon base region 34 of the gate 32. Referring to FIG. 3c, a gate oxide layer 30 is formed on the surface of the silicon device layer 26 over the active region 18. Thereafter, the base gate region 34 of the gate 32 is formed on the surface of the gate oxide layer 30 to define the upper region 42 of the channel region 16 in a conventional CMOS self aligned gate, source, and drain process. The gate oxide layer 30 is typically grown on the surface of the active region 18 using a thermal oxidation process and a polysilicon layer is deposited on top of the gate oxide layer 30 using a low pressure chemical vapor deposition (LPCVD) process. The polysilicon layer is pre-doped by phosphorus (4e15 cm-2, 15 KeV) and annealed for 10 seconds at 950C in RTA. The polysilicon layer is then patterned and etched using conventional photolithography techniques to form the base gate region 42.

Thereafter, at step 56, halo implants are formed in the active region 18 by implanting boron (1–3e13 cm-2, 1–2 KeV) and annealed for 1 second at 950C in Nitrogen and portions of the silicon substrate on opposing sides of the base gate region 34 to form low dose extension of both the source region 12 and the drain region 14 with phosphorus (5e13–1e14 cm-2, 3–5 Kev) at zero degree tilt. These low does extensions do not extend through the entire thickness of the silicon device layer 26. Because the ions cannot penetrate the polysilicon gate, the polysilicon gate effectively operates as a mask which results in doping only the exposed source region 12 and drain region 14 as shown in FIG. 3c.

Figure 3D:
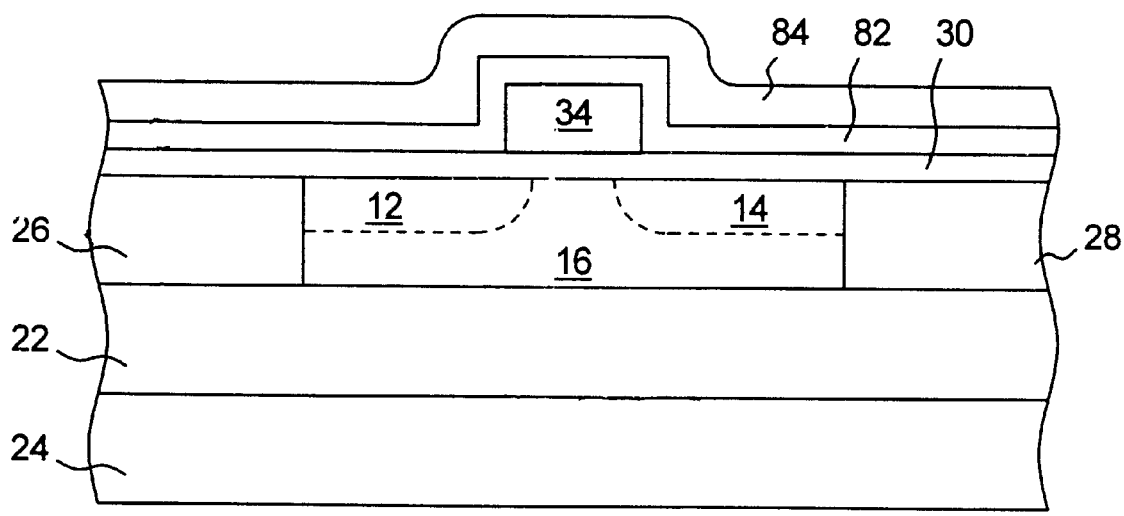
FIG. 3d is a cross section diagram of showing the structure of the FET of FIG. 1 at a partially complete fabrication step.
Figure 3E:
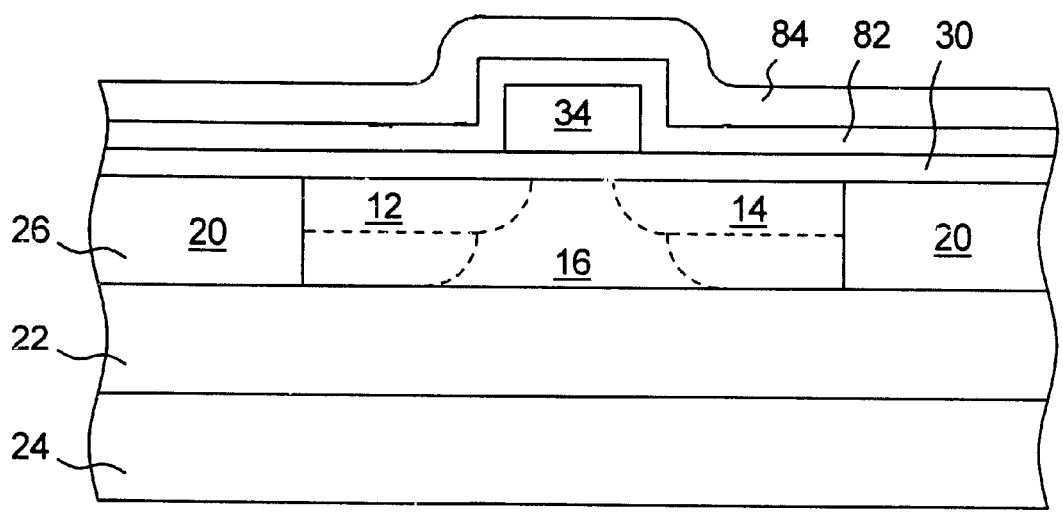
FIG. 3e is a cross section diagram of showing the structure of the FET of FIG. 1 at a partially complete fabrication step.

Step 58 represents applying an oxide layer 82, approximately 10 nm thick, and a blanket silicon nitride layer 84, approximately 40–60 nm thick over the base gate region 34 and over the entire surface of the wafer 28 as shown in FIG. 3d. It should be appreciated that the thickness of the silicon nitride layer 84 extends to a thickness equal to or greater than the thickness of the base gate region 34 adjacent to the base gate region 34. As such, at. step 60, when the source region 12 and drain region 14 are further doped by implanting phosphorus (2–3e15 cm-2, 10–20 KeV) annealing for 5 to 10 seconds at 1020–1040C, the doping is masked by both the base gate region 34 and the thick regions of the nitride layer 84 adjacent to the base gate region 34. Therefore, the implant of this step 60 forms the high does regions of the source region 12 and the drain region 14 and leaves the wide lower channel region 44 un-doped as shown in FIG. 3e.

Figure 3F:
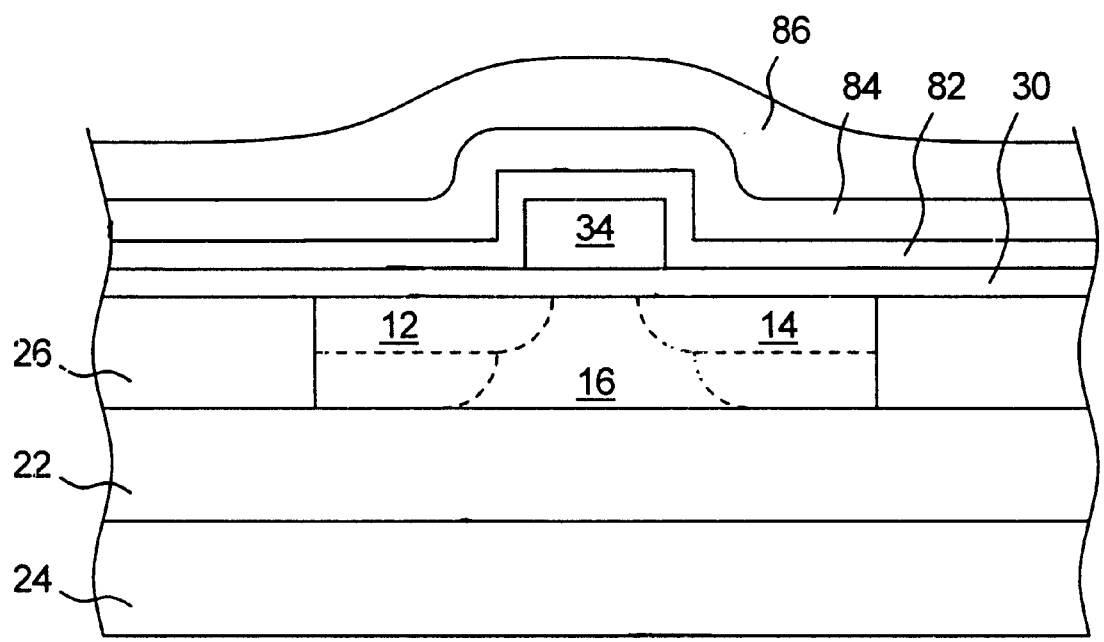
FIG. 3f is a cross section diagram of showing the structure of the FET of FIG. 1 at a partially complete fabrication step.
Figure 3G:
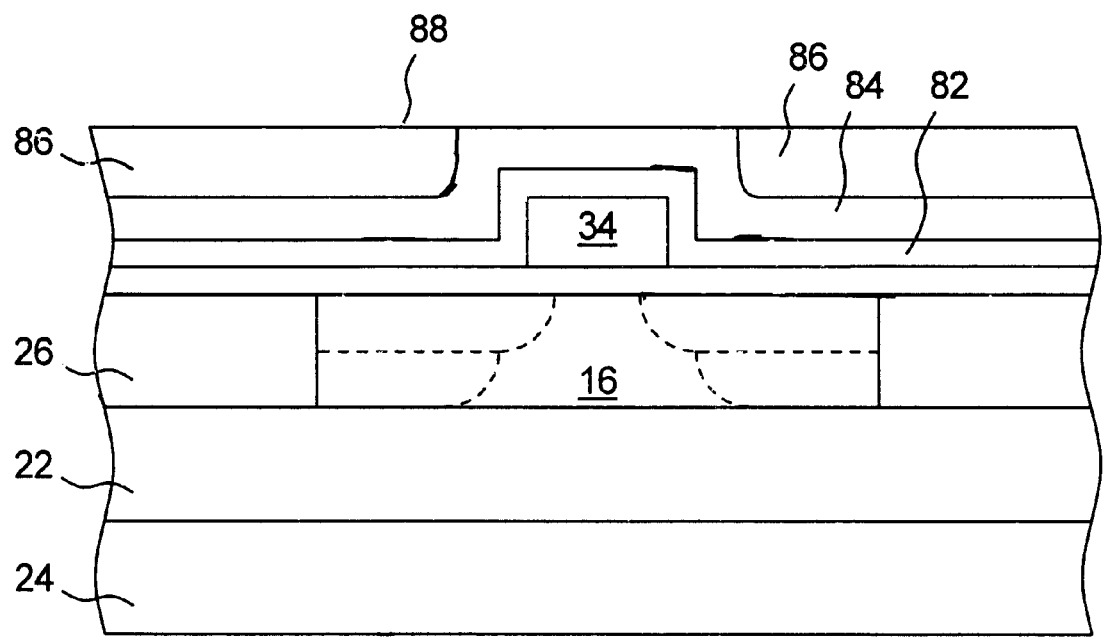
FIG. 3g is a cross section diagram of showing the structure of the FET of FIG. 1 at a partially complete fabrication step.

At step 62, a layer of TEOS 86 is applied to cover the silicon nitride layer 84 as shown in FIG. 3f. Thereafter, at step 64, the surface is polished to a flat surface 88 wherein the nitride 84 is exposed as an island within the TEOS 86 above the base region 34 as shown in FIG. 3g.

Figure 3H:
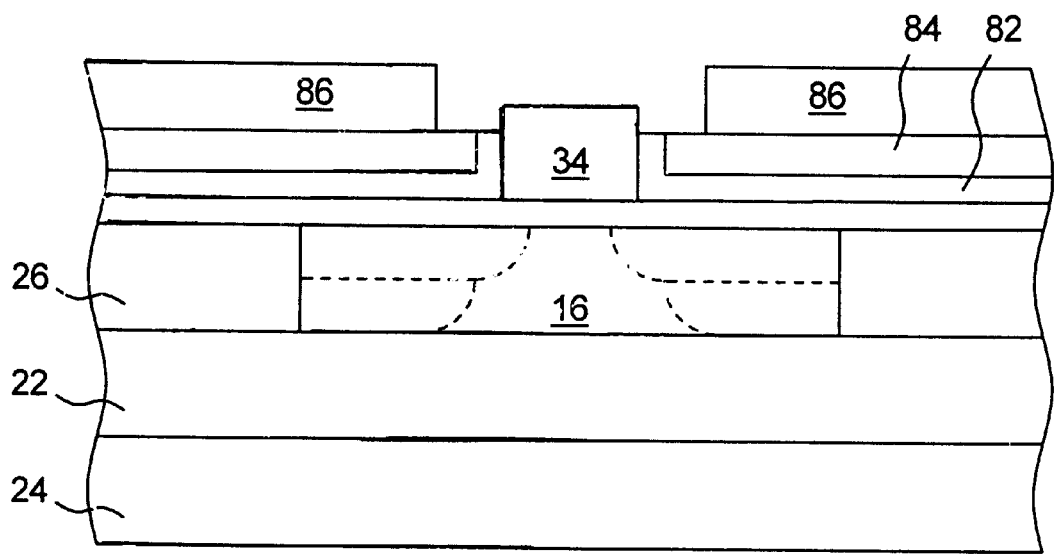
FIG. 3h is a cross section diagram of showing the structure of the FET of FIG. 1 at a partially complete fabrication step.
Figure 3I:
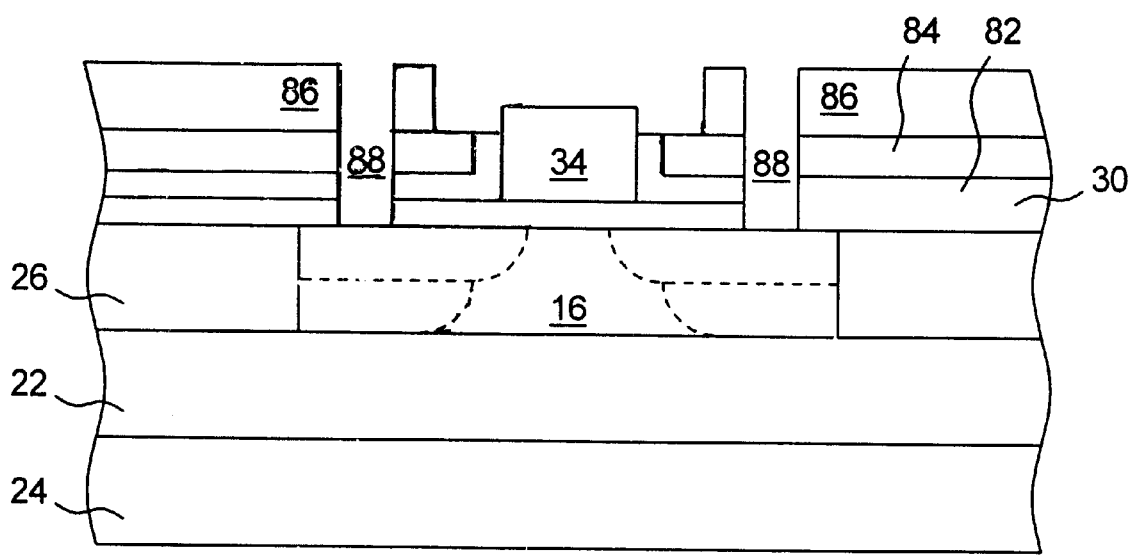
FIG. 3i is a cross section diagram showing the structure of the FET of FIG. 1 at a partially complete fabrication step.

Step 66 represents etching the nitride 84 above the base region 34 to a depth wherein the base region 34 is exposed in a well within the TEOS 86 as is shown in FIG. 3h. Preferably, the etch is a wet etch using phosphoric acid and the etch is deep enough such that the nitride 84 is recessed 30–60 nm below the top of the base region 34.

At step 68, a contact region on the surface of each of the source reason 12 and the drain region 14 are exposed by etching wells 88 in the TEOS 86, nitride layer 84, oxide layer 82, and gate oxide 30. Known photolithography processes are used to mask and pattern the wells 88 and chemicals of appropriate selectivity are used to perform the etching.

Figure 3J:
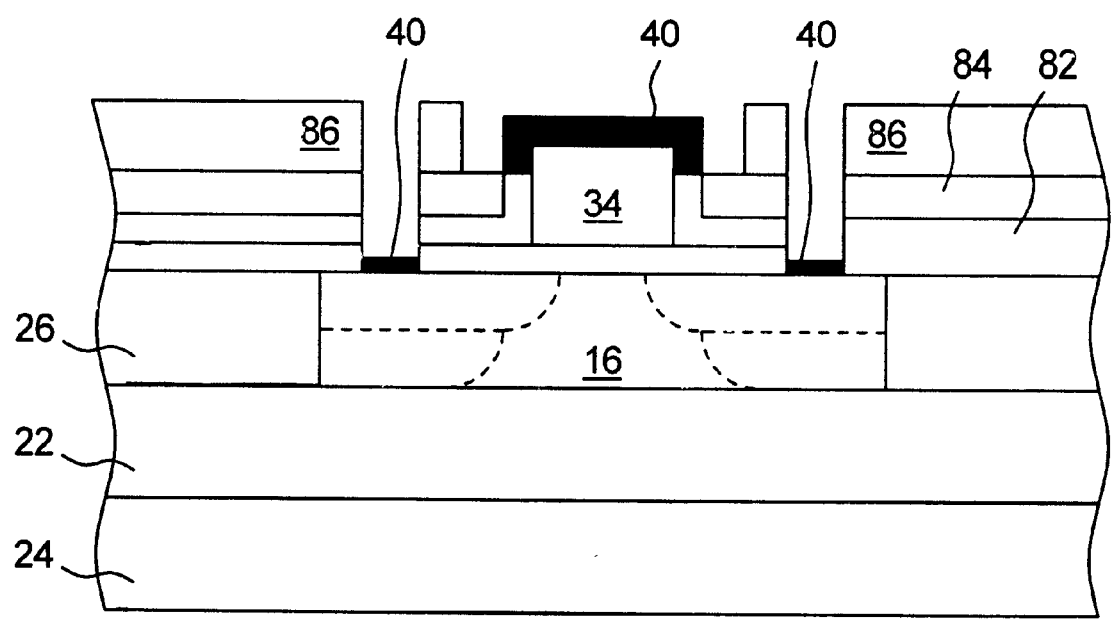
FIG. 3j is a cross section diagram showing the structure of the FET of FIG. 1 at a partially complete fabrication step.

Step 70 represents depositing a titanium nitride diffusion layer 40 on the exposed silicon regions of the source region 12, drain region 14 and polysilicon base gate region 39 as shown in FIG. 3j. Thereafter, referring again to FIG. 1, tungsten damascene is deposited in each of the wells 88 to form the source and drain contacts coupling the source region 12 and the drain region 14 to the metal layers 38 and into the wide cap region to form the tungsten damascene wide cap region of the gate 32

These processing steps described with reference to the flowchart of FIG. 2 in combination with the diagrams of FIGS. 3a through 3j yield the fully depleted FET 10 as described with reference to FIG. 1.

It should be appreciated that the FET 10 structure and processes of fabricating such a semiconductor result in a unique field effect transistor structure which behaves as a fully depleted FET when in the "on" state to reduce "kink" in the I-V curve yet behaves as a wide channel device in the "off" state to reduce off-state current leakage.

Although the invention has been shown and described with respect to certain preferred embodiments, it is obvious that equivalents and modifications will occur to others skilled in the art upon the reading and understanding of the specification. The present invention includes all such equivalents and modifications, and is limited only by the scope of the following claims.

What is claimed is:

1. A fully depleted field effect transistor with a wide gate cap formed on a silicon on insulator substrate including a thin silicon device layer positioned over an insulating layer, the field effect transistor comprising:

an active region formed in the silicon device layer and including a source region and a drain region of a first conductivity type on opposing sides of a central channel region of a second conductivity type, wherein said second conductivity type is opposite to said first conductivity type, and each of said source and drain regions has a lightly doped region and a heavily doped region;

a gate oxide layer extending over the top surface of the active region;

a base gate layer formed on the gate oxide layer and above the central channel region, wherein the base gate layer being formed of a semiconductor material and having a top surface, a first side surface and a second side surface opposing said first side surface;

a first insulating layer formed on the gate oxide layer and over said source and drain regions, wherein said first insulating layer is adjacent to the first and second side surfaces of said base gate layer and has a top surface at a level lower than the top surface of the base gate layer;

the wide gate cap is formed on and electrically connected to the base gate layer, wherein the wide gate cap is formed of a metal and has a middle portion covering the top surface of the base gate layer and two side portions in contact with a portion of the top surface of the first insulating layer and respectively covering top portions of the first and second side surfaces of the base gate layer; and contact openings formed in said first insulating layer and extending to said source and drain regions, respectively, wherein the central channel region is of a full-depletion type and has an upper channel region adjacent the base gate layer and a lower channel region beneath the upper channel; said upper channel region is positioned between and abutting the lightly doped regions of the source and drain regions and has a width approximately equal to or less than that of the base gate layer, said lower channel region is positioned between and abutting the heavily doped regions of said source and drain regions and has a width approximately equal to that of the wide gate cap.

2. The fully depleted field effect transistor of claim 1, wherein the wide gate cap is formed of tungsten.

3. The fully depleted field effect transistor of claim 2, wherein the width of the upper channel region is smaller than that of said base gate layer.

4. The fully depleted field effect transistor of claim 3, wherein the wide gate cap is formed through a damascene process.

5. The fully depleted field effect transistor of claim 1, wherein the base gate layer is formed of polysilicon, and the wide gate cap is formed of tungsten through a damascene process.

6. The fully depleted field effect transistor of claim 1, wherein a diffusion barrier is formed between the base gate layer and the wide gate cap.

7. The fully depleted field effect transistor of claim 6, wherein the diffusion barrier comprises titanium nitride.

8. A semiconductor device comprising a plurality of fully depleted field effect transistors formed on a silicon-on-insulator substrate, each of said transistor comprising:

an active region formed in a silicon device layer and including a source region and a drain region of a first conductivity type on opposing sides of a central channel region of a second conductivity type, wherein said second conductivity type is opposite to said first conductivity type, and each of said source and drain regions has a lightly doped region and a heavily doped region;

a gate oxide layer extending over the top surface of the active region;

a base gate layer formed on the gate oxide layer and above the central channel region, wherein the base gate layer being formed of a semiconductor material and having a top surface, a first side surface and a second side surface opposing said first side surface;

a first insulating layer formed on the gate oxide layer and over said source and drain regions, wherein said first insulating layer is adjacent to the first and second side surfaces of said base gate layer and has a top surface at a level lower than the top surface of the base gate layer;

a wide gate cap formed on and electrically connected to the base gate layer, wherein the wide gate cap is formed of a metal and has a middle portion covering the top surface of the base gate layer and two side portions in contact with a portion of the top surface of the first insulating layer and respectively covering top portions of the first and second side surfaces of the base gate layer, and contact openings formed in said first insulating layer and extending to said source and drain regions, respectively, wherein the central channel region is of a full-depletion type and has an upper channel region adjacent the base gate layer and a lower channel region beneath the upper channel; said upper channel region is positioned between and abutting the lightly doped regions of the source and drain regions and has a width approximately equal to or less than that of the base gate layer; said lower channel region is positioned between and abutting the heavily doped regions of said source and drain regions and has a width approximately equal to that of the wide gate cap.

9. The semiconductor device of claim 8, further including a plurality of isolation trench regions isolating the active region of said each transistor from corresponding adjacent transistors of the polarity of transistors.

10. The semiconductor device of claim 9, wherein the wide gate cap is formed of tungsten.

11. The semiconductor device of claim 10, wherein the width of the upper channel region is smaller than that of said base gate layer.

12. The semiconductor device of claim 11, wherein the wide gate cap is formed through a damascene process.

13. The semiconductor device of claim 12, wherein the silicon device layer has the second conductivity type as the central channel region.

14. The semiconductor device of claim 8, wherein the base gate layer is formed of polysilicon, and the wide gate cap is formed of tungsten through a damascene process.

15. The semiconductor device of claim 8, wherein a diffusion barrier is formed between the base gate layer and the wide gate cap.

16. The semiconductor device of claim 15, wherein the diffusion barrier comprises titanium nitride.

* * * * *